(12) United States Patent
Niwa et al.

(10) Patent No.: US 6,433,441 B1
(45) Date of Patent: Aug. 13, 2002

(54) AREA ARRAY TYPE SEMICONDUCTOR DEVICE

(75) Inventors: Kouichirou Niwa; Hirofumi Nakajima, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/613,304

(22) Filed: Jul. 10, 2000

(30) Foreign Application Priority Data

Jul. 9, 1999 (JP) .............................................. 11-196236

(51) Int. Cl.[7] .......................... H01L 29/40; H01L 23/52; H01L 23/48
(52) U.S. Cl. ........................ 257/784; 257/783; 257/786; 257/691; 257/696; 257/698
(58) Field of Search ................................ 257/784, 786, 257/783, 691, 698, 696

(56) References Cited

U.S. PATENT DOCUMENTS

| | | | | |
|---|---|---|---|---|
| 4,835,120 A | * | 5/1989 | Mallik et al. | ................ 437/209 |
| 5,402,318 A | * | 3/1995 | Otsuka et al. | ............... 361/794 |
| 5,459,634 A | * | 10/1995 | Nelson et al. | ........... 361/306.3 |
| 5,798,571 A | * | 8/1998 | Nakajima | .................... 257/784 |
| 6,303,878 B1 | * | 10/2001 | Kondo et al. | ................ 174/261 |

FOREIGN PATENT DOCUMENTS

JP 04042532 A * 2/1992

OTHER PUBLICATIONS

Yee, L. Low et al, "Modeling and Experimental Verification of the Interconnect Mesh Power System (IMPS) MCM Topology", IEEE Transactions on Components, Packaging, and Manufacturing Technology—Part B, vol. 20, No. 1, Feb. 1997, pp. 42–49.*

* cited by examiner

Primary Examiner—Nathan Flynn
Assistant Examiner—Johannes P Mondt
(74) Attorney, Agent, or Firm—Young & Thompson

(57) ABSTRACT

An area array type semiconductor device employing a single side wiring board in which a signal waveform is not likely to be disturbed even if a higher speed signal is applied includes more ground pads than the number of ground external terminals (ground wire land). The ground wire is formed in a larger width than the other wires on a single side of a substrate so as to form a plane, and gaps between the ground wire and the signal wire or the power wire are set to be substantially equal.

5 Claims, 6 Drawing Sheets

○ S LAND (SIGNAL WIRE LAND)  ● G LAND (GROUND WIRE LAND)  ⊘ P LAND (POWER WIRE LAND)

: G LEAD

○ S LAND (SIGNAL WIRE LAND)  ● G LAND (GROUND WIRE LAND)  ⊘ P LAND (POWER WIRE LAND)

AREA ARRAY TYPE SEMICONDUCTOR DEVICE

BACKGROUND OF THE INVENTION

1. Technical Field of the Invention

The present invention relates to a high speed area array type semiconductor device.

2. Description of the Prior Art

Recently, a signal speed of a semiconductor device has been increasing. The signal speed is limited, due to wave form deformation of signal in the semiconductor device.

In a double sided wiring board, a signal wiring is formed on one side, while a ground plane is formed on the other side to increase its ground conductive area, thereby matching characteristic impedance in order to suppress the deformation of the high speed signal waveform. The double sided wiring board can operate in higher frequency range than the single sided wiring board. Inversely, saying, the single sided wiring board has a disadvantage that the high speed operation is inferior to the double sided wiring board, because the ground plane cannot be formed.

However, manufacturing the double sided wiring board is costly, compared with the single side wiring board, particularly, the double sided wiring board with a film substrate of TAB (tape automated bonding) tape.

FIGS. 6A and 6B show a conventional area array type semiconductor (TBGA (tape BGA) having single side wiring) employing TAB (tape automated bonding), BGA (ball grid array) and single side wiring.

Generally, the number of ground pads of a semiconductor chip 1 is suppressed to a lower limit in order to maintain manufacturing efficiency. In the conventional area array type semiconductor device shown in FIG. 6A, the number of the ground pads is also suppressed to a lower limit and minimum ground wiring is formed on a substrate. As a result, more signal pads and signal wires are provided than the other types.

As shown in FIG. 6B, in the conventional area array type semiconductor device, the signal pads (S pads), ground pads (G pads) and power pads (P pads) are arrayed on each side of the semiconductor chip 1. Because the number of the S pads is larger than the other pads, there are many places where the S pads adjoin each other. In the conventional area array type semiconductor device, there are vacant pads R, for example, two vacant pads, as shown in FIG. 6B. Therefore, the S pads adjoin across the vacant pad at a position, while other S pads adjoin each other directly at other position. Further, signal wires (S leads) leading from the S pads run in parallel.

In the configuration as shown in FIG. 6B, the signal waveforms are easily deformed, because two signal waves run in parallel. On the contrary, the signal waveform is stabilized if the ground wires (G leads) which are the routes through which the signal waves return through a load are arranged in parallel to each other.

SUMMARY OF THE INVENTION

Therefore, an object of the invention is to provide an area array type semiconductor device employing a single side wiring board which can be produced at a low cost and in which the signal waveform is not likely to be deformed, even if high speed signal is applied.

According to a first aspect of the present invention to solve the above problem, there is provided an area array type semiconductor device, wherein a semiconductor chip having signal pads, ground pads and power pads are mounted on a substrate, wires leading from each of the pads are placed on a single side of the substrate and external connecting terminals are placed on the wires, the number of the ground pads being larger than the number of ground external terminals.

The signal pad, ground pad and power pad mentioned in this specification mean signal electrode pad, ground electrode pad, and power electrode pad of a semiconductor chip respectively. The signal wire means a wire leading from the signal pad of the semiconductor chip on a substrate. The ground wire means a wire leading from the ground pad of the semiconductor on the substrate. The power wire means a wire leading from the power pad of the semiconductor on the substrate. The signal external terminals means an external terminal of the area array type semiconductor device connected to the signal wire. The ground external terminal means an external terminal of the ground wire and the power external terminal means an external terminal of the power wire.

According to the area array type semiconductor device of the first aspect, because the number of the ground pads is larger than the number of the ground external terminals, additional ground pads can be placed between two signal pads adjacent on a semiconductor chip conventionally. As a result, the number of adjacent signal pads, further adjacent signal wires can be reduced. Instead, the number of the signal pads adjacent to the ground pad, further signal wires adjacent to the ground wire can be increased, so that a loop circuit (composed of the signal pad and ground pad) which may cause noise can be reduced in size. Consequently, even if a higher frequency signal is applied, the signal waveform is not likely to be disturbed and the signal waveform is stabilized. Thus, there is such an advantage that performance of correspondence to high speed signal is improved with respect to the prior art.

According to the first aspect of the present invention, more ground pads are provided than the number of the ground external terminals. Consequently, the ground pads do not correspond to the ground external terminals one to one and thus, at least one or more of the ground external terminals are shared by wires leading from plural ground pads.

According to a second aspect of the present invention, there is provided an area array type semiconductor device, wherein a semiconductor chip having signal pads, ground pads and power pads are mounted on a substrate, wires leading from each of the pads are placed on a single side of the substrate and external connecting terminals are placed on the wires, the ground wire being formed in a larger width than the other wires and gaps between the ground wires and the signal wires being substantially equal.

Thus, according to the area array type semiconductor device of the second aspect, the gap between the ground wire and the signal wire is substantially equal, so that characteristic impedance matching is always secured from the signal pad to the signal external terminal. Consequently, even if a higher frequency signal is applied, the signal waveform is not likely to be disturbed but stabilized. Thus, there is such an effect that the performance of correspondence to high speed signal is improved with respect to the conventional art.

Although the gap between the ground wire and the signal wire is preferred to be always constant on respective parts of the substrate to ensure such an effect, even if the gaps cannot be made completely constant, that effect can be secured.

It is preferred that the ground wire is formed in a larger width than the other wires (signal wire, power wire) so as to secure as large area as possible. Although in such a case, the gap between the ground wire and the signal wire narrows, it is preferable that the gap is at least about 20 µm from viewpoint of insulation reliability.

Further, by making the ground wires short-circuit between each other, it is possible to select a path for current to flow to the ground external terminal freely. As a result, current flows into a ground wire adjacent to a signal wire to which the current flows, thereby minimizing magnetic field. A feature of the third aspect of the present invention is that the ground wires short-circuit between each other in the area array type semiconductor device of either the first or second aspect of the present invention.

Further, the ground wires are expanded around the power wires so as to maintain the gap with respect to the signal wire constant and secure characteristic impedance matching.

According to a fourth aspect of the present invention, there is provided an area array type semiconductor device according to the first-third aspects, wherein the ground wires are placed in a plane shape in a region excluding the signal wires, power wires and surrounding thereof on the substrate.

Here, the gap between the ground wire and the power wire is preferred to be at least about 20 µm from viewpoints of insulation reliability.

According to a fifth aspect of the present invention, there is provided an area array type semiconductor device according to the fourth aspect, wherein a predetermined pattern is subscribed in the ground wire formed in the plane shape.

Therefore, according to the area array type semiconductor device of the fifth aspect, in addition to the advantage of the fourth aspect, there is such an advantage that a drop of a firm contact with resin or the like for protecting the surface of the wires can be prevented.

Further, the predetermined pattern is capable of reducing a stress generated in the wiring plane and preventing heat generation, increase of resistance and deterioration of copper foil and the like.

If the predetermined pattern is formed for example, in mesh pattern or polka-dot pattern, both the above mentioned firm contact and prevention of a local stress can be secured.

A larger width of the power wire induces less inductance, thereby making it possible to suppress a disturbance of signal waveform.

Then, according to a sixth aspect of the present invention, there is provided an area array type semiconductor device according to any of the first to fifth aspects, wherein the power wire is formed in a larger width than the signal wire.

According to a seventh aspect of the present invention, there is provided an area array type semiconductor device according to any of the first to sixth aspects, wherein the power external terminals are placed so that deviation of distance from the semiconductor chip to the power external terminal is suppressed and an average distance from the semiconductor chip to the power external terminals is shorter than distances from the semiconductor chip to the signal external terminals and is also shorter than distances from the semiconductor chip to the ground external terminals.

Thus, according to the area array type semiconductor device of the seventh aspect of the present invention, in addition to the advantages of the first to sixth aspects, deviation of the distance from the semiconductor chip to the power external terminal is suppressed and the power external terminals are placed so that the distance from the semiconductor chip to the power external terminal is shorter than the distance from the semiconductor chip to the signal external terminal and the distance from the semiconductor chip to the ground external terminal on average. Thus, the power external terminals are placed at a substantially equal distance from the semiconductor chip and placed nearer the semiconductor chip than the signal external terminal and the ground external terminal. Consequently, respective powers can be adjusted to equal potential and the characteristic impedance of the semiconductor device can be lowered, so that a disturbance of the signal waveform is suppressed and the performance of correspondence to high speed signal is improved.

As described above, according to the present invention, some means for improving the characteristic impedance matching and reducing the characteristic impedance are taken in the area array type semiconductor device having single side wiring. As a result, the high speed corresponding performance of the area array type semiconductor device of the single side wiring can be improved. Additionally, there is an effect that such an area array type semiconductor device having a high high-speed corresponding performance can be provided at a cheap price.

PREFERRED EMBODIMENT OF THE INVENTION

The ground pads are arranged in a narrower pitch in the present invention, more ground pads are placed. Therefore, the TAB (tape automated bonding) technology which enables narrow pitch bonding is recommended to connect a semiconductor chip. However, in the wire bonding technology as well, bonding technology corresponding to the narrow pad pitch has been progressed remarkably. Therefore, the present invention can be applied to other connecting methods such as wire bonding and flip chip bonding. Further, the present invention can be applied, regardless of connecting method for external terminals such as BGA (ball grid array), LGA (land grid array) and PGA (pin grid array).

Here, the preferred embodiment of the present invention is explained with reference to the drawings.

FIG. 1 is a schematic plan view showing an area array type semiconductor device of the present invention.

As shown in FIG. 1, a semiconductor chip 1 is placed in a square hole portion 2 in the center of a substrate of the area array type semiconductor device and wires are bonded to respective pads of the semiconductor chip 1. The respective wires are led on the substrate and a signal wire leading from the signal pad (S pads) runs on the substrate. An end of each wire is formed in a circular shape to provide a signal wire land (S land). Likewise, a power wire (P lead) leading from the power pad (P pad) runs on the substrate and an end thereof is formed in a circular shape to provide a power wire land (P land). Ground wires (G leads) leading from the ground pad (G pad) are placed in a plane except a slight space for securing insulation for the signal wire (S lead) on the substrate, P lead and surrounding. As a result, one of the features of the present invention is that the G leads are short-circuited with each other.

Cover resist is coated on the wiring layer of the substrate. Circular holes are formed in the cover resist at the external terminals. The circular end portions of the S lead and the P leads are exposed through such circular holes, so that those exposed portions serve for the S land and P land. A peripheral edge of the circular end portion is slightly covered with cover resist.

On the other hand, a part of a portion formed in plane shape of the G lead is also exposed through the circular hole of the cover resist, so that that exposed portion serves for the G land.

Although not indicated, a soldering ball is attached to each land as the external terminal.

The respective lands and external terminals are placed on the substrate in grid structure.

Figure 1A:
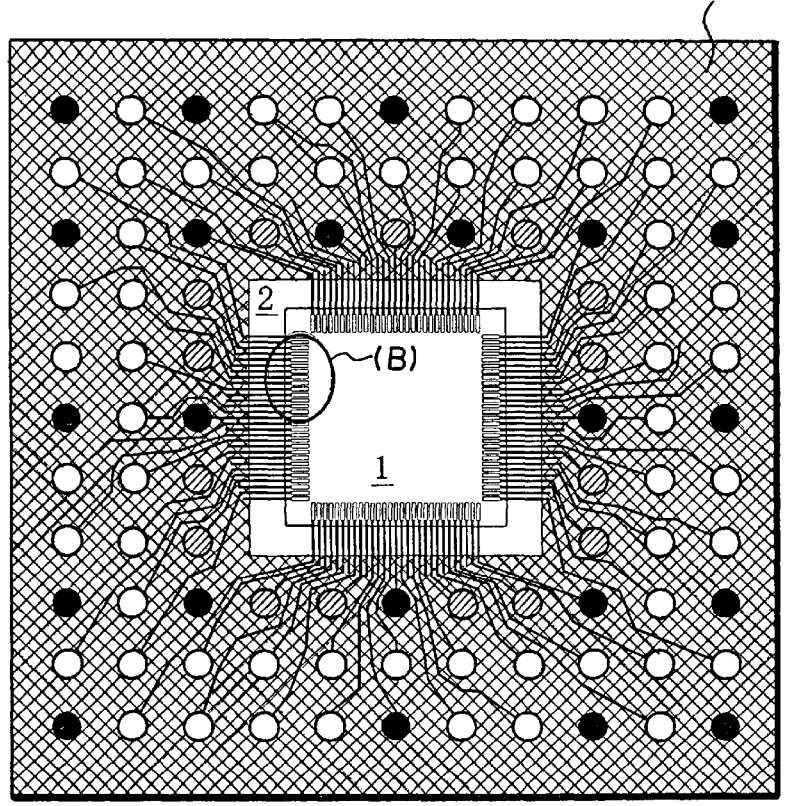
FIGS. 1A and 1B are schematic plan views showing an area array type semiconductor device according to an embodiment of the present invention.

In the area array type semiconductor device as shown in FIG. 1A, deviation of a distance from the semiconductor chip 1 to the power external terminal is suppressed and further, the power wire lands (P lands) are placed nearest the semiconductor chip 1 or in the innermost circle such that a distance from the semiconductor chip 1 to the power external terminal is shorter than a distance from the semiconductor chip 1 to the signal external terminal and a distance from the semiconductor chip 1 to the ground external terminal on average. Such a structure contributes to stabilization of the signal waveform and further improvement of correspondence to increased signal speed.

Figure 1B:
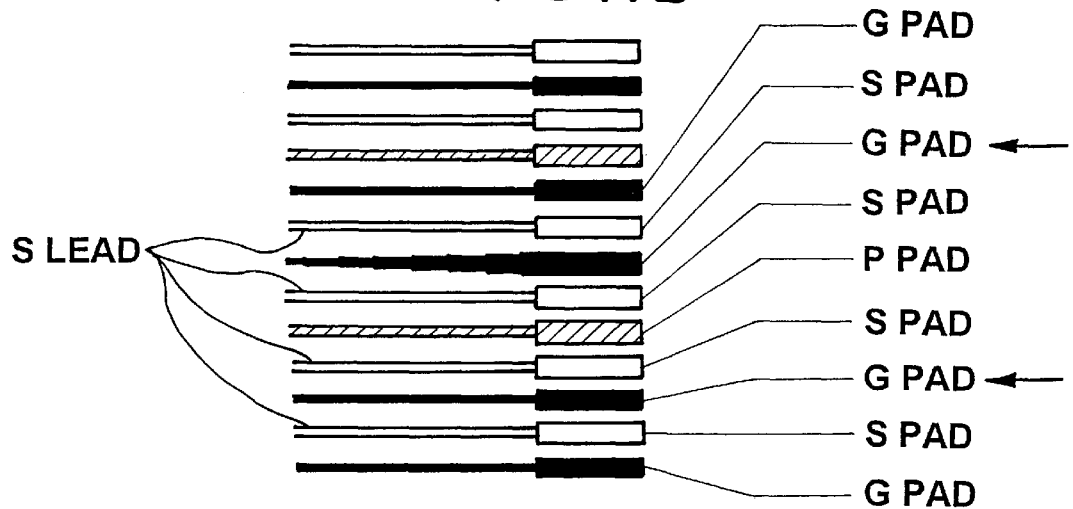

The area array type semiconductor device of this embodiment has more G pads than the number of the ground external terminals. As evident as a result of comparison of FIG. 1B and FIG. 6B, the G pads provided in an additional quantity are placed between the S pads. As shown in FIG. 1B, the G pads are placed at a position corresponding to the vacant pads R shown in FIG. 6B such that it is located between the adjacent S pads. Such a structure contributes to an effect of improving the high speed correspondence performance with respect to the conventional art because the signal waveform is not likely to be disturbed but remains stable even if a high frequency signal is applied.

The ground wire (G lead) is formed in a large width than the other wires (signal wire (S lead), power wire( P lead)) as long as its design is allowed. A gap between the G lead and the S lead and a gap between the G lead and the P lead can be set to 30 μm in a high density wire region substantially at a tip of the lead.

Further, a mesh like pattern is inscribed in the ground wire Glead formed in the plane shape. The mesh like pattern shown in FIG. 1A is not that on the cover resist, but indicates a mesh like pattern inscribed on the G lead. Although not distinguished on this Figure, the P lead is formed in a larger width than the S lead.

As a supplement for the above description, the area array type semiconductor device of the present invention is described with reference to FIGS. 2 and 3.

Figure 2:
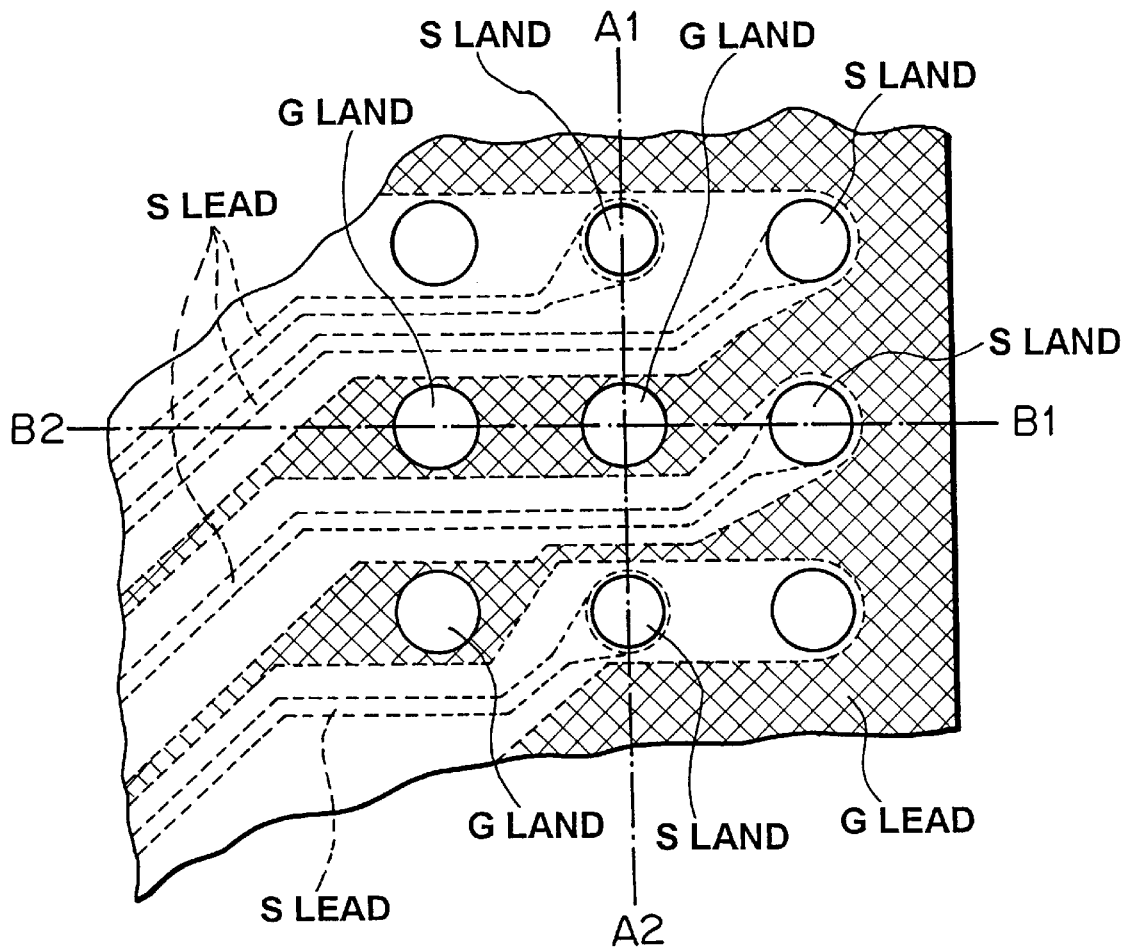
FIG. 2 is a partially enlarged view showing an enlarged peripheral portion of a wiring board of FIG. 1 in detail.
Figure 2:
Figure 3A:
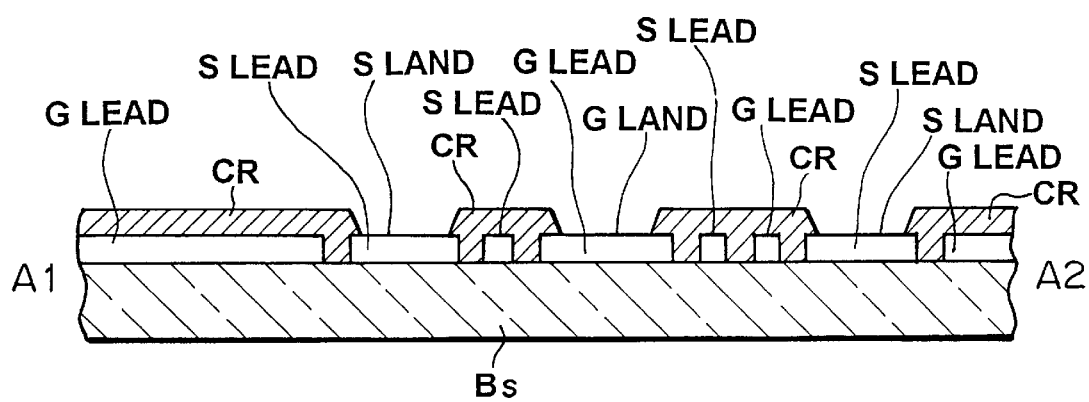
FIG. 3A is a sectional view taken along the line A1–A2 of FIG. 2
Figure 3B:
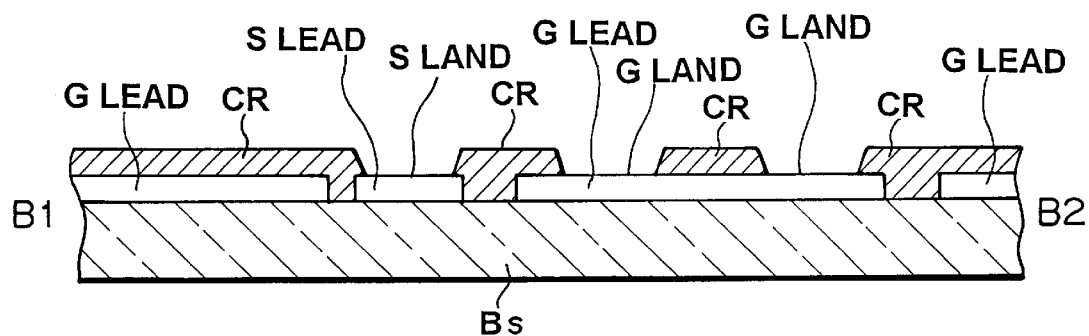
FIG. 3B is a sectional view taken along the line B1–B2.

FIG. 2 is a partially enlarged view showing an peripheral area of a wiring board of FIG. 1 in detail. FIG. 3A is a sectional view taken along the line A1–A2 of FIG. 2 and FIG. 3B is a sectional view taken along the line B1–B2.

As indicated by dotted line of FIG. 2, the G lead are arranged in a plane shape except a slight area for securing insulation for the S lead and the P lead (not shown) on the substrate and surrounding. The G lead leading from a number of the G pad on the semiconductor chip 1 forms a single plane on such a substrate region. As a result, the G leads are short-circuited with each other and the G pads share fewer ground external terminals than the number of the G pads. A mesh like pattern is inscribed on the surface thereof.

FIG. 2 indicates an edge of the cover resist with a circle of solid line. Copper foil exposed from such a circular hole acts as a land for mounting a soldering ball which is an external terminal.

In the sectional view taken along the line A1–A2, as shown in FIG. 3A, a substrate Bs is located on the bottom and then, the G lead, S lead, S lead, G lead, S lead, G lead, S lead, and G lead are arranged in order from the left on the substrate Bs.

In the sectional view taken along the line B1–B2, as shown in FIG. 3B, a substrate Bs is located on the bottom and then, G lead, S lead, G lead and G lead are arranged in order from the left on the substrate Bs.

Because as described above, a rate of disposing the G lead on both sides of the S lead is higher than the conventional wiring board, this structure contributes to characteristic impedance matching and improvement of performance of correspondence to high speed signal.

As shown in FIGS. 3A and 3B, the cover resist CR not only covers the wires to protect them, but also is filled between the wires so as to raise insulation therebetween. A face not covered with the cover resist CR of the wire surface acts as a land for mounting the soldering ball which is the external terminal.

The area array type semiconductor device as described above is the best mode including all of the first to seventh aspects of the present invention.

Thus, respective effects of all of the first to seventh aspects of the present invention are obtained. Needless to say, the present invention is not restricted to this embodiment, but it is permissible to select and apply one or more of the first to seventh aspects of the present invention depending on some conditions like production cost.

The inventors of the present invention carried out simulations on the TBGA to measure the effect of the present invention. The simulations and their results are described below.

A simulation method for analyzing a sectional structure of two dimensions based on finite—element method was employed and Ansoft Maxell SI (Signal Integrity) 2D-Extractor was used as an analytic tool.

Figure 4:
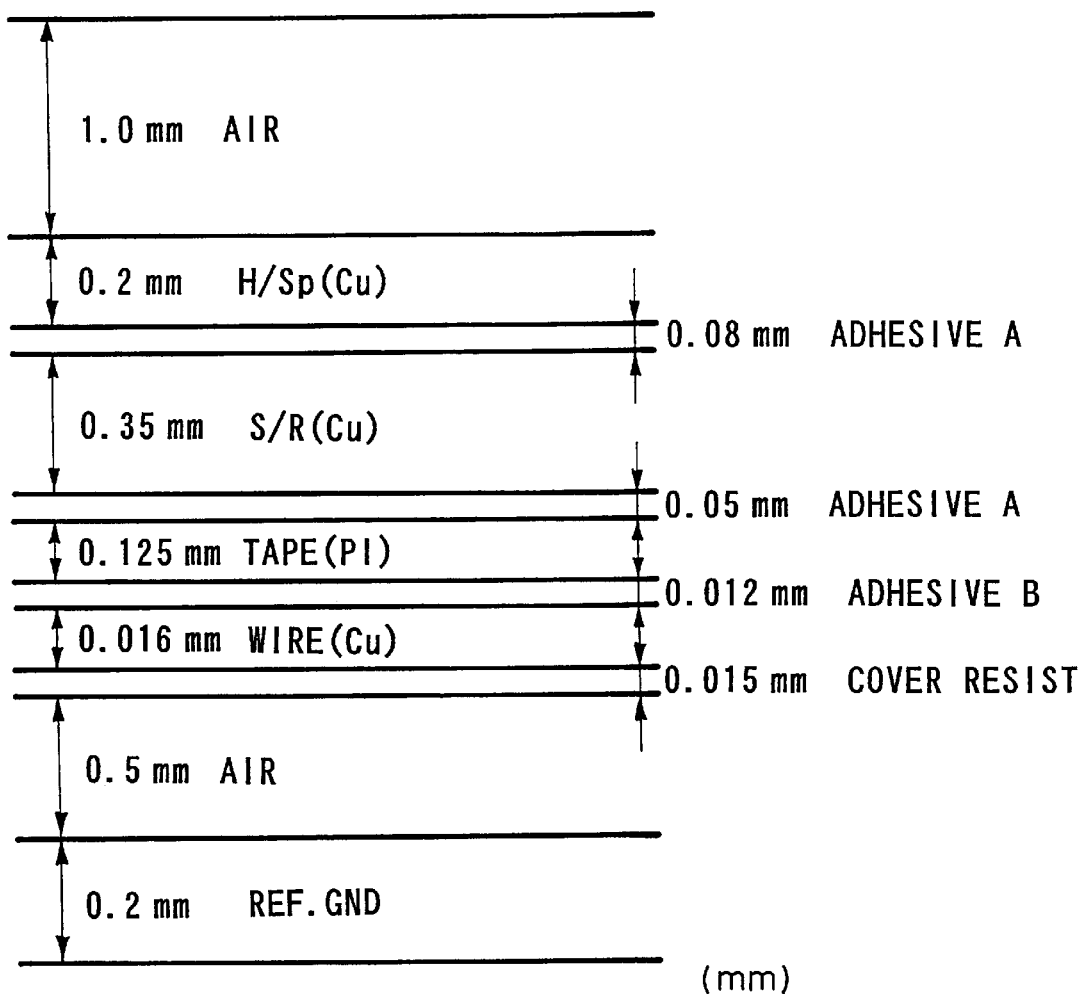
FIG. 4 is a sectional view showing a composition of a sectional structure of model 1 (conventional example) and model 2 (present invention) which are objective of simulation.
Figure 6A:
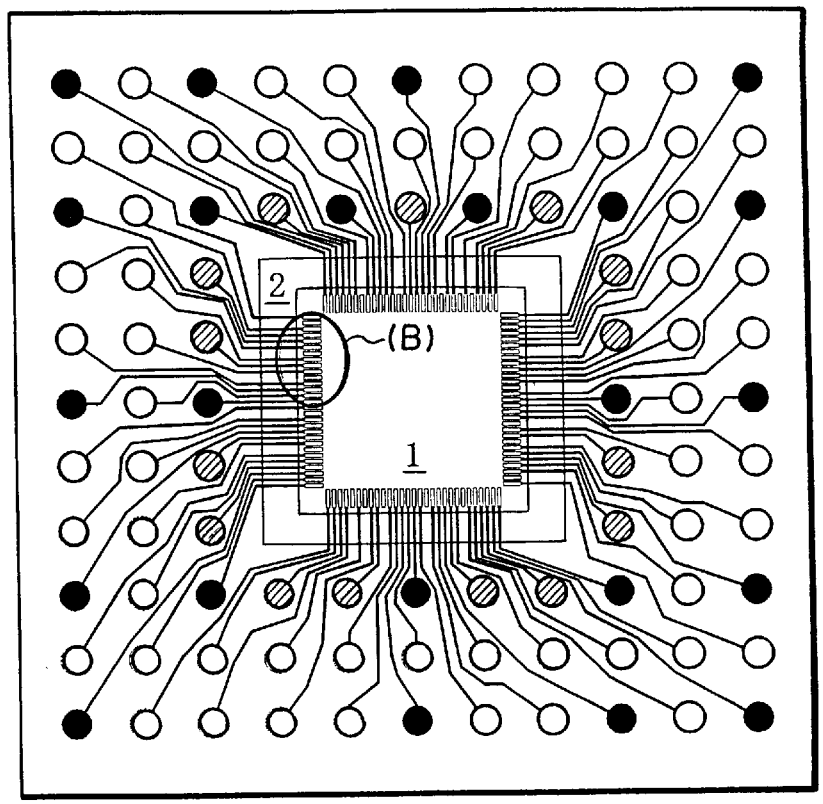
FIGS. 6A and 6B are schematic plan views showing a conventional area array type semiconductor device employing a single side wiring.
Figure 6B:
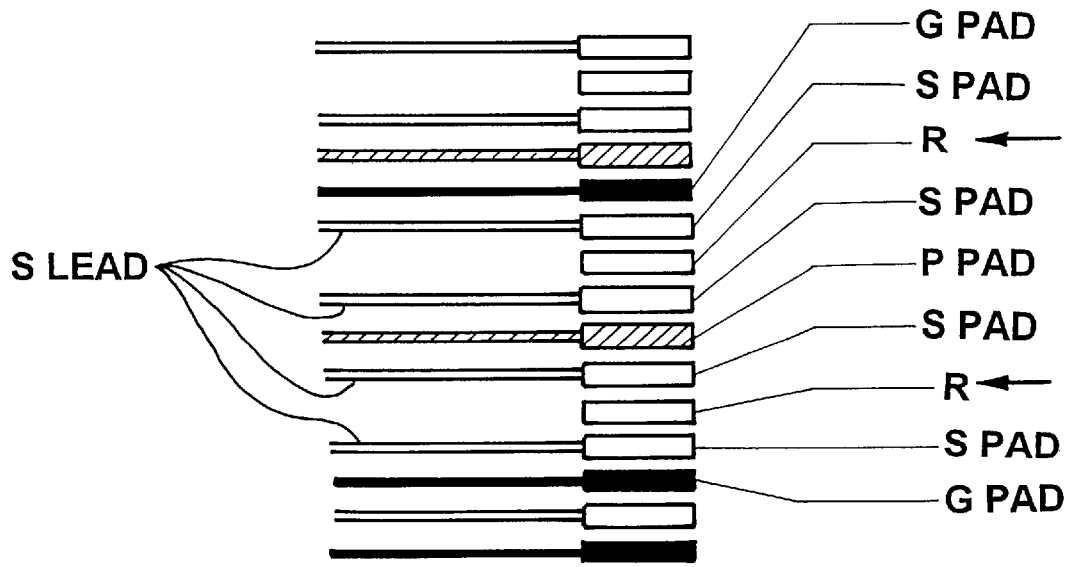

The analytic models are TBGA according to the conventional area array type semiconductor device described with reference to FIG. 6 as model 1 and TAGA according to the area array type semiconductor device of this embodiment as model 2. Its sectional structure and physical property are described in FIG. 4.

As for the composition and thickness of the sectional structure, if mentioned from the bottom, a reference ground GND is 0.2 mm, spatial air is 0.5 mm, cover resist is 0.015 mm, wire (Cu) is 0.016 mm, adhesive agent B is 0.012 mm, polymide tape is 0.125 mm, adhesive agent A is 0.05 mm, stiffener S/R (Cu) is 0.35 mm, adhesive agent A is 0.08 mm, heat spreader H/SP (Cu) is 0.2 mm, and spatial air is 1.0 mm. These are common between model 1 and model 2.

As for the physical property, conductivity σ of Cu is $58.14 \times 10^{6^6}$ S/m, dielectric constant ∈ r is 3.5 for adhesive agent A, 2.8 for adhesive agent B, 3.5 for polymide (PI) and 2.19 for the cover resist.

Dielectric loss tangent tan δ is $1.3 \times 10^{-3}$ for polymide (PI) and $15 \times 10^{-3}$ for the cover resist. These are common between the model 1 and model 2.

Figure 5A:
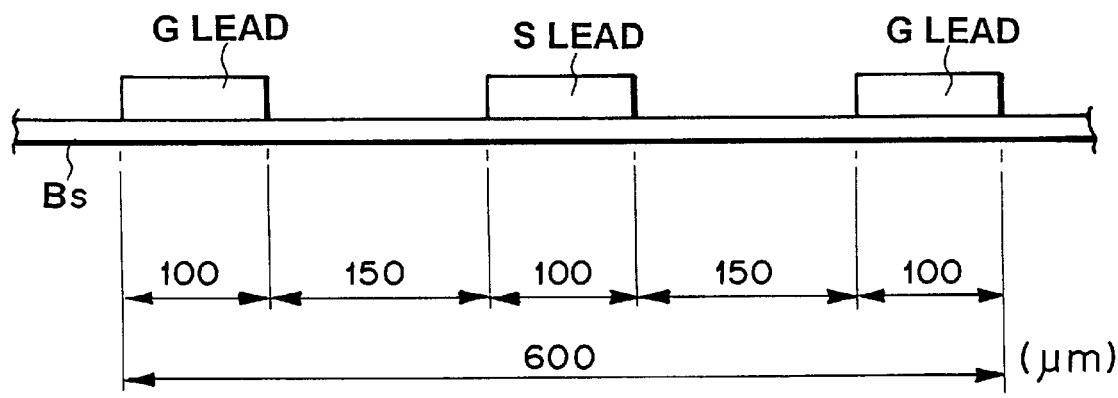
FIG. 5A is a sectional view showing a wiring pitch of model 1 (conventional example) which is objective of simulation and FIG. 5B is a sectional view showing a wiring pitch of model 2 (present invention) which is objective of simulation.
Figure 5B:
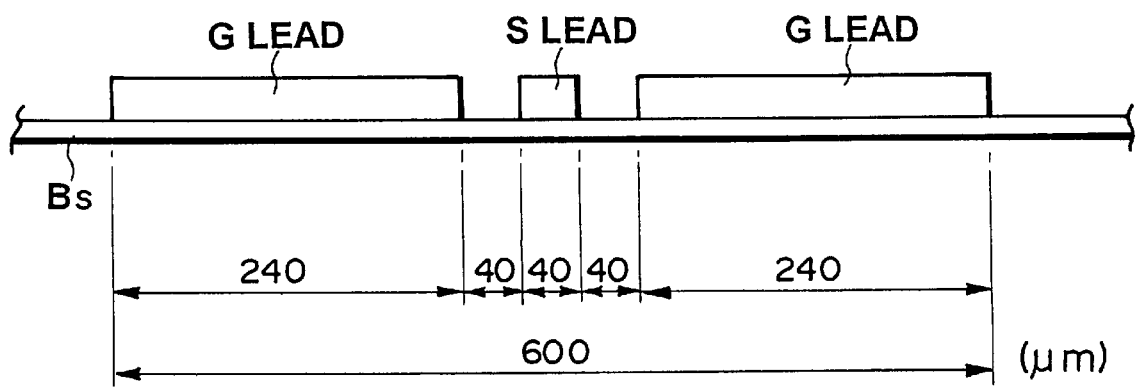

The width of the ground wire (G lead), width of the signal wire (S )lead and a gap between the G lead and the S lead are indicated in FIG. 5A for the model 1 and FIG. 5B for the model 2. As compared to the model 1, the width of the G lead is as large as 240 μm and the width of the S lead is as small as 40 μm. As a result, the gap between the G lead and the S lead is as small as 40 μm.

An installation surface was set up on ideal-GND for both the models 1 and 2. The stiffener S/R (Cu) which was a conductor other than the wires was treated by floating. From the reference ground GND to the stiffener S/R(Cu) was modeled, the heat spreader was omitted and an error ratio was set to 1%.

The characteristic impedance of the models 1 and 2 calculated under the above condition are 102Ω for model 1 and 71Ω for model 2.

A ratio of the characteristic impedance of the model 2 with respect to the characteristic impedance of the model 1 is 72/102=71%, which is one of indexes indicating that the performance of correspondence to high speed signal of the TBGA of the model 2, namely, a single side wiring of the present invention is higher than the TBGA of the model 1 namely the conventional single side wiring.

Because a drop rate of the characteristic impedance of a tape BGA (ball grid array) of which body size is 40 mm×40 mm with 576 pins in double sided wiring is 67% with respect to the conventional single side wiring, according to the present invention employing the single side wiring board, the same high speed correspondence performance as the double sided wiring board can be achieved.

What is claimed is:

1. An area array type semiconductor device, comprising:
   a substrate having a first surface with a periphery;
   a semiconductor chip within said periphery, said semiconductor chip having signal pads, power pads, and ground pads;
   signal lands and power lands on said first surface within said periphery in an array at a first level;
   signal wires and power wires connecting respective ones of said signal pads and said power pads to respective ones of said signal lands and said power lands, at least first portions of said signal wires extending across said first surface at said first level; and
   a ground plane extending across said first surface at said first level to said periphery, said ground plane having fingers extending at said first level between said signal lands and said first portions of said signal wires, said ground plane having parts thereof that are ground lands in said array, and said ground pads being connected to said ground plane through ground wires.

2. The device of claim 1, wherein said semiconductor chip has more of said ground pads than said ground plane has of said ground lands.

3. The device of claim 1, wherein said ground wires have a greater width than said signal wires and said power wires, and wherein gaps between said ground wires and said signal wires are substantially equal.

4. The device of claim 1, further comprising a resist at a second level that covers said ground plane and said first portions of said signal wires and does not cover said ground, signal, and power lands, said resist extending to said first level among said ground plane, said first portions of said signal wires, and said signal lands.

5. The device of claim 1, wherein said semiconductor chip is on said first surface.

* * * * *